US010455727B1

United States Patent
Mikjaniec et al.

(10) Patent No.: US 10,455,727 B1
(45) Date of Patent: Oct. 22, 2019

(54) APPARATUS, SYSTEM, AND METHOD FOR COOLING NETWORK DEVICES VIA UNUSED POWER SUPPLY SLOTS

(71) Applicant: Juniper Networks, Inc., Sunnyvale, CA (US)

(72) Inventors: Travis S. Mikjaniec, Fremont, CA (US); Susheela Nanjunda Rao Narasimhan, Fremont, CA (US); Gauri R. Khanolkar, Sunnyvale, CA (US); Katsuhiro Okamura, Royal Oaks, CA (US)

(73) Assignee: Juniper Networks, Inc, Sunnyvale, CA (US)

( * ) Notice: Subject to any disclaimer, the term of this patent is extended or adjusted under 35 U.S.C. 154(b) by 0 days.

(21) Appl. No.: 15/985,277

(22) Filed: May 21, 2018

(51) Int. Cl.
*H05K 7/20* (2006.01)
*G06F 1/26* (2006.01)
*G06F 1/3206* (2019.01)

(52) U.S. Cl.
CPC ......... *H05K 7/20136* (2013.01); *G06F 1/263* (2013.01); *G06F 1/3206* (2013.01)

(58) Field of Classification Search
CPC .................................................. H05K 7/20136
See application file for complete search history.

(56) References Cited

U.S. PATENT DOCUMENTS

| 5,954,823 A * | 9/1999 | Cutts ...................... G06F 1/189 713/300 |
| 7,256,515 B2 * | 8/2007 | Liang ................. H05K 7/20209 307/43 |
| 7,486,526 B1 * | 2/2009 | Frangioso, Jr. ...... G11B 33/128 361/756 |
| 2010/0164427 A1 * | 7/2010 | Dishman ................ G06F 1/206 318/705 |
| 2014/0277818 A1 * | 9/2014 | Peterson ................ G06F 1/206 700/300 |

* cited by examiner

*Primary Examiner* — Mukundbhai G Patel
(74) *Attorney, Agent, or Firm* — FisherBroyles, LLP (57) ABSTRACT

The disclosed apparatus may include may include (1) an active power supply blank that (A) fits within a power supply slot of a network device that forwards network traffic and (B) generates airflow that cools the network device and (2) a power interface that electrically couples the active power supply blank to the network device, wherein the power interface enables the active power supply blank to (A) draw electrical power from the network device and (B) generate the airflow that cools the network device using the electrical power drawn from the network device. Various other apparatuses, systems, and methods are also disclosed.

18 Claims, 5 Drawing Sheets

APPARATUS, SYSTEM, AND METHOD FOR COOLING NETWORK DEVICES VIA UNUSED POWER SUPPLY SLOTS

Network devices often generate significant amounts of heat. As the performance demands of such network devices increase, so too may the amounts of heat generated by those network devices. Unfortunately, if too much heat is generated, the performance of those network devices may be impaired, thus preventing them from reaching their full potential.

In an effort to reduce such heat, some network equipment manufacturers may incorporate cooling components and/or technologies into their network devices. For example, a network equipment manufacturer may design a network device (such as a router) that includes slots for various power supplies. When installed in those slots, the power supplies may provide power to components of the network device that are responsible for forwarding traffic to other devices. To mitigate the heat issue, each power supply may include a cooling fan that generates airflow intended to cool the network device.

However, in some situations, the network device may be able to achieve the desired performance without necessarily installing a power supply into each of those slots. For example, the network device may be deployed by a company's network administrator within an enterprise network. In this example, the network device may be able to satisfy the company's needs with less than the maximum number of power supplies.

As a result, the company's network administrator may opt to run the network device with less than the maximum number of power supplies. Thus, the network device may have at least one unused power supply slot. To prevent air loss and/or the misdirection of airflow, the network administrator may install a dummy power supply blank into the unused power supply slot. In this example, the dummy power supply blank may simply cover the power supply slot but neither provide power to nor generate airflow for the network device.

The instant disclosure, therefore, identifies and addresses a need for additional and improved apparatuses, systems, and methods for cooling network devices via unused power supply slots.

SUMMARY

As will be described in greater detail below, the instant disclosure generally relates to apparatuses, systems, and methods for cooling network devices via unused power supply slots. In one example, an apparatus for accomplishing such a task may include (1) an active power supply blank that (A) fits within a power supply slot of a network device that forwards network traffic and (B) generates airflow that cools the network device and (2) a power interface that electrically couples the active power supply blank to the network device, wherein the power interface enables the active power supply blank to (A) draw electrical power from the network device and (B) generate the airflow that cools the network device using the electrical power drawn from the network device.

Similarly, an active power supply blank that accomplishes the same task as the above apparatus may include (1) a cooling fan that (A) fits within a power supply slot of a network device that forwards network traffic and (B) generates airflow that cools the network device and (2) a power interface that electrically couples the cooling fan to the network device, wherein the power interface enables the cooling fan to (A) draw electrical power from the network device and (B) generate the airflow that cools the network device using the electrical power drawn from the network device.

A corresponding method may include (1) installing an active power supply blank into a power supply slot of a network device that forwards network traffic, (2) electrically coupling the active power supply blank to the network device such that the active power supply blank is able to draw electrical power from the network device, and then (3) generating, by the active power supply blank installed in the power supply slot of the network device, airflow that cools the network device using the electrical power drawn from the network device.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure describes various apparatuses, systems, and methods for cooling network devices via unused power supply slots. The term "power supply slot," as used herein, generally refers to any type or form of housing and/or slot designed to fit and/or accept a power supply that provides electrical power to a network device. The term "unused power supply slot," as used herein, generally refers to any power supply slot in which a power supply is not installed.

As will be described in greater detail below, embodiments of the apparatuses, systems, and methods disclosed herein may be able to cool certain components of a network device that includes multiple power supply slots. For example, in the event that the network device is operating on less than the maximum number of power supplies, one or more of those power supply slots may be empty and/or unused. In this example, rather than simply covering any empty and/or unused power supply slots to prevent air loss and/or the misdirection of airflow, one or more active power supply blanks may be installed into such slots.

These active power supply blanks may include a cooling device (such as a fan) that generates airflow that cools certain components of the network device. In addition, these active power supply blanks may include a power interface that facilitates drawing electrical power from the network device. By drawing electrical power from the network device via the power interface, these active power supply blanks may be able to generate airflow and cool the network device using electrical power provided by one or more of the power supplies installed into the other power supply slots.

The following will provide, with reference to FIGS. 1-4, detailed descriptions of exemplary apparatuses, systems, and/or implementations for cooling network devices via unused power supply slots. Finally, the discussion corresponding to FIG. 5 will provide a detailed description of an exemplary method for cooling network devices via unused power supply slots.

Figure 1:
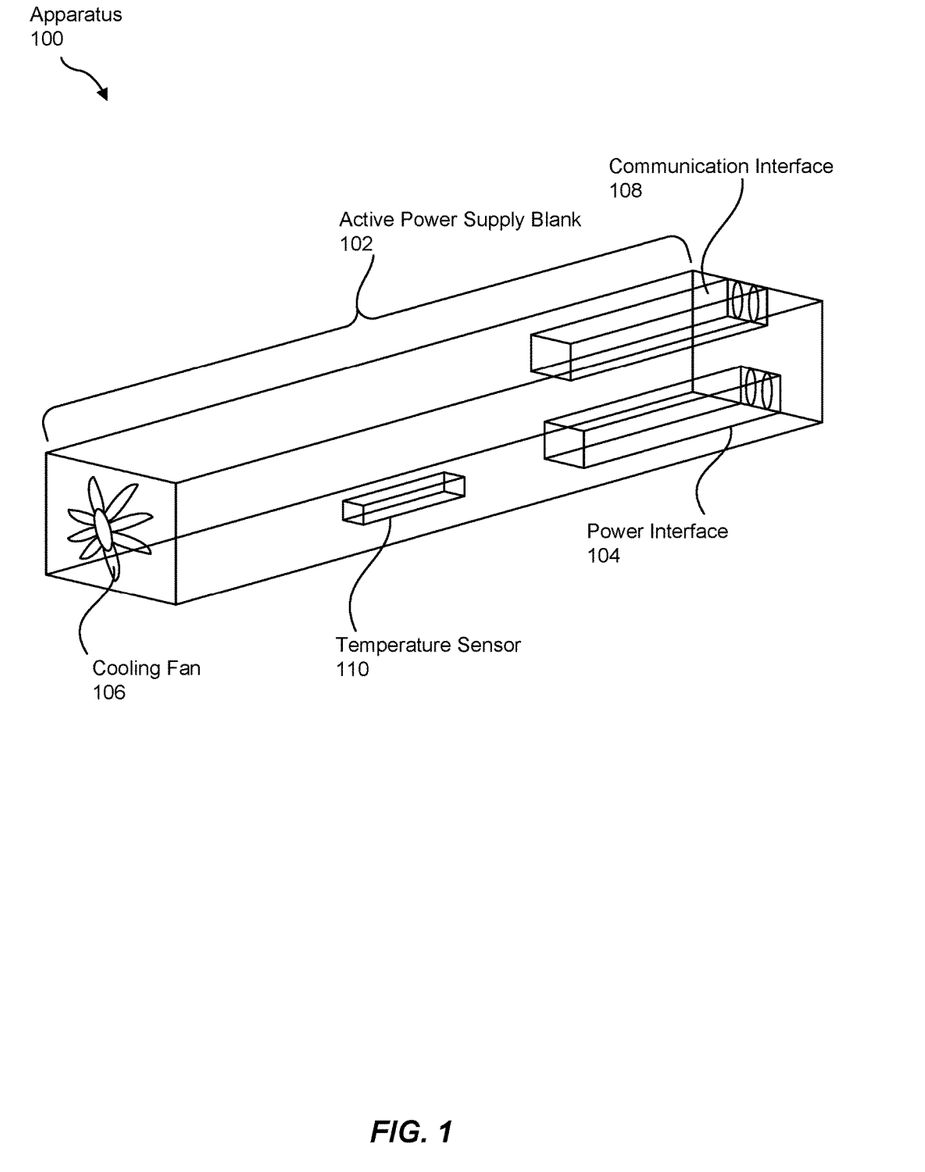
FIG. 1 is an illustration of an exemplary apparatus for cooling network devices via unused power supply slots.

FIG. 1 illustrates an exemplary apparatus 100 for cooling network devices via unused power supply slots. As illustrated in FIG. 1, exemplary apparatus 100 may include and/or represent an active power supply blank 102 that is designed to fit within and/or be installed into a power supply slot of a network device (such as a router) that forwards network traffic. In this example, active power supply blank 102 may generate airflow that cools the network device.

In some examples, active power supply blank 102 may represent a physical structure and/or device whose form factor is consistent with a power supply designed for the corresponding slot. Accordingly, active power supply blank 102 and such a power supply may be interchangeable with one other. In other words, active power supply blank 102 may be able to replace such a power supply in the corresponding slot.

As illustrated in FIG. 1, active power supply blank 102 may include a power interface 104. In some examples, power interface 104 may electrically couple active power supply blank 102 to the power supply slot of the network device and/or a midplane circuit board of network device. Power interface 104 may include and/or represent any type or form of connector and/or jack that facilitates the transfer of electrical power.

In some examples, power interface 104 may physically attach to the network device to facilitate the transfer of electrical power. In other examples, power interface 104 may electrically couple active power supply blank 102 to the network device by way of inductive energy transfer using electromagnetic fields. Examples of power interface 104 include, without limitation, midplane power connectors, backplane power connectors, barrel power connectors, power headers, blade-type power connectors, card-edge power connectors, power entry connectors, terminal block connectors, male members, female receptacles, electromagnetic induction couplings, combinations or variations of one or more of the same, and/or any other type of power interface.

In some examples, active power supply blank 102 may include and/or incorporate one or more cooling devices and/or mechanisms. For example, as illustrated in FIG. 1, active power supply blank 102 may include a cooling fan 106. In one example, cooling fan 106 may include and/or represent a collection of vanes and/or blades designed to generate and/or create airflow when rotating in one direction or another. In other words, the vanes and/or blades of cooling fan 106 may produce currents of air as they rotate about a central axis point. Increasing the rotational speed of cooling fan 106 may cause cooling fan 106 to generate more airflow. In contrast, decreasing the rotational speed of cooling fan 106 may cause cooling fan 106 to generate less airflow.

In some examples, active power supply blank 102 may be able to communicate with one or more components of the network device and/or certain power supplies installed in the network device's power supply slots. For example, as illustrated in FIG. 1, active power supply blank 102 may include a communication interface 108. In some examples, communication interface 108 may communicatively couple active power supply blank 102 to the power supply slot of the network device and/or a midplane circuit board of the network device. Communication interface 108 may include and/or represent any type or form of connector and/or jack that facilitates the transfer of communication signals.

In some examples, communication interface 108 may physically attach to the network device to facilitate the transfer of communication signals. In other examples, communication interface 108 may communicatively couple active power supply blank 102 to the network device by way of wireless communication technology. Examples of communication interface 108 include, without limitation, communication headers, circular connectors, rectangular connectors, fiber optic connectors, midplane communication connectors, backplane communication connectors, card-edge communication connectors, modular connectors, male members, female receptacles, Bluetooth devices, WiFi devices, wireless radios, combinations or variations of one or more of the same, and/or any other type of communication interface.

In some examples, active power supply blank 102 may be equipped to measure ambient air temperatures. For example, as illustrated in FIG. 1, active power supply blank 102 may include a temperature sensor 110. In some examples, temperature sensor 110 may measure temperatures within the corresponding power supply slot in which active power supply blank 102 is installed. Temperature sensor 110 may include and/or represent any type or form of sensor and/or device that measures ambient air temperatures and/or converts readings of ambient air temperatures into digital representations. Examples of temperature sensor 110 include, without limitation, thermistors, thermocouples, resistance thermometers, temperature transducers, thermostatic switches, combinations or variations of one or more of the same, and/or any other suitable type of temperature sensor.

As indicated above, apparatus 100 in FIG. 1 is merely illustrative in nature, and several other embodiments and/or variants of apparatus 100 may be implemented to facilitate cooling network devices via unused power supply slots. For example, one or more of cooling fan 106, communication interface 108, and/or temperature sensor 110 may be omitted from apparatus 100 and/or replaced by another component in apparatus 100. Additionally or alternatively, apparatus 100 may include and/or incorporate various other components (such as circuit boards, additional sensors, additional cooling devices, additional interfaces, etc.) that are not necessarily illustrated in FIG. 1.

Figure 2:
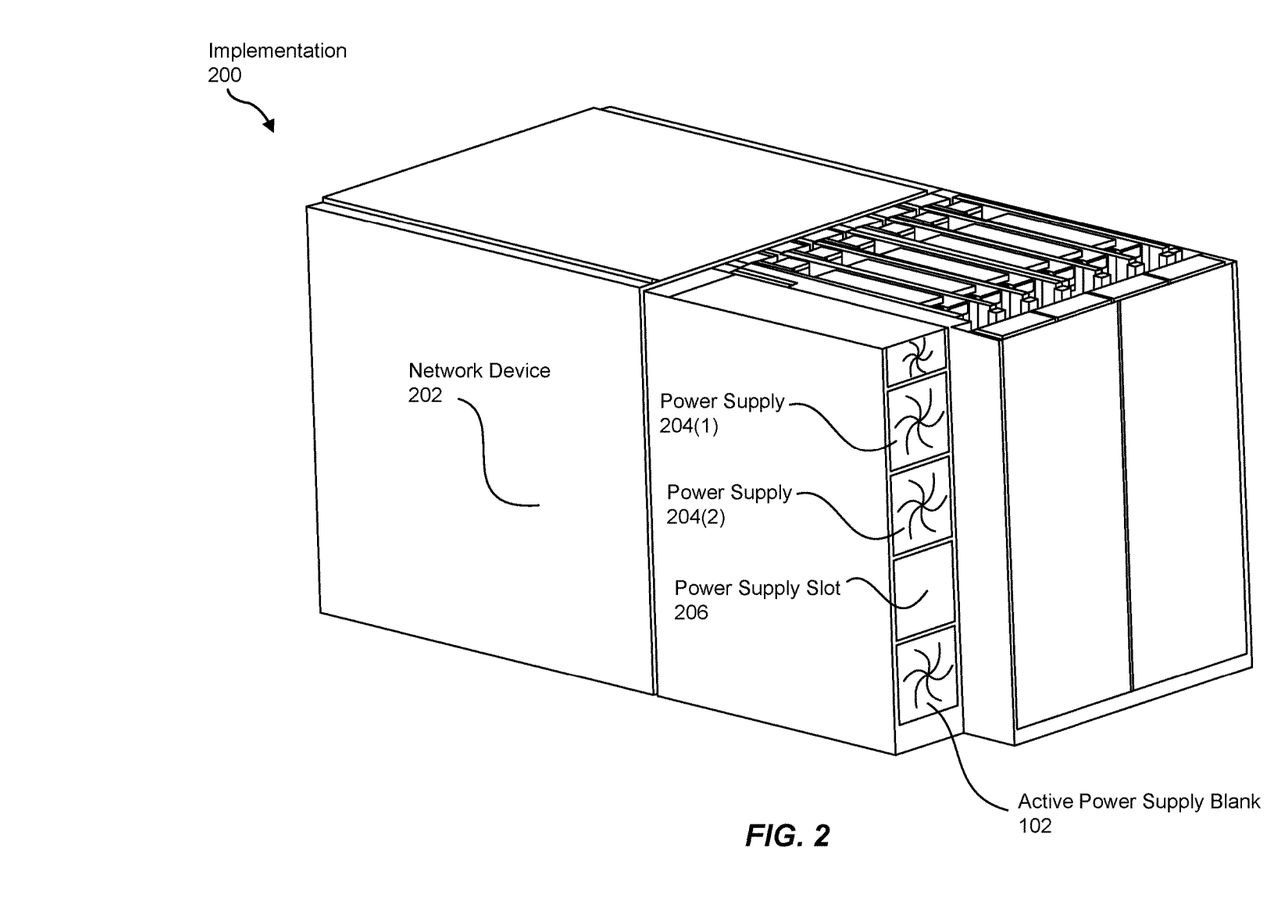
FIG. 2 is an illustration of an exemplary implementation of an apparatus for cooling network devices via unused power supply slots.

FIG. 2 illustrates an exemplary implementation 200 of apparatus 100 for cooling network devices via unused power supply slots. As illustrated in FIG. 2, exemplary implementation 200 may include, involve, and/or represent a network device 202 that is equipped to house multiple power supplies in power supply slots. In one example, network device 202 may include and/or represent a router (such as provider edge routers, hub routers, spoke routers, autonomous system boundary routers, and/or area border routers). Additional examples of network device 202 include, without limitation, switches, hubs, modems, bridges, repeaters, gateways, multiplexers, network adapters, network interfaces, network racks, chasses, servers, computing devices, client devices, portions of one or more of the same, combinations or variations of one or more of the same, and/or any other suitable network device.

In some examples, network device 202 may include multiple slots into which power supplies 204(1) and 204(2) are installed. In such examples, when installed into those slots, power supplies 204(1) and 204(2) may supply, provide, and/or deliver electrical power to network device 202. Power supplies 204(1) and 204(2) may each include a cord (not illustrated in FIG. 2) that is plugged into a power outlet and/or generator. When their cords are plugged into a power outlet and/or generator in this way, power supplies 204(1) and 204(2) may each be able to draw electrical power from the power outlet and/or generator and then carry that electrical power to network device 202. In one example, power supplies 204(1) and 204(2) may each include and/or be equipped with cooling fans that generate airflow intended to cool network device 202.

As illustrated in FIG. 2, network device 202 may also include another slot into which active power supply blank 102 is installed. In some examples, active power supply blank 102 may fit within that slot of network device 202 and generate airflow that cools network device 202. For example, active power supply blank 102 may be electrically coupled to network device 202 via power interface 104. In one example, power interface 104 may physically couple and/or attach to a power bus and/or a midplane circuit board of network device 202 that is accessible via the power supply slot.

The electrical coupling between active power supply blank 102 and network device 202 may enable active power supply blank 102 to receive and/or draw electrical power from network device 202. For example, active power supply blank 102 may draw electrical power from the power bus and/or midplane circuit board of network device 202 via power interface 104. In this example, active power supply blank 102 may use that electrical power to generate airflow that cools network device 202. More specifically, active power supply blank 102 may cause cooling fan 106 to spin and/or rotate in one direction or another to generate airflow.

In some examples, the airflow generated by active power supply blank 102 may flow toward the midplane circuit board of network device 202. Additionally or alternatively, the airflow generated by active power supply blank 102 may be channeled into network device 202 and traverse out of network device 202 via an exhaust and/or exhaust fan. In one example, the airflow generated by active power supply blank 102 may traverse from active power supply blank 102 through a bank of linecards (not explicitly labelled in FIG. 2) before exiting via the exhaust and/or exhaust fan. In doing so, the airflow may cool the midplane and/or linecards as they forward network traffic on behalf of network device 202.

As illustrated in FIG. 2, network device 202 may also include a power supply slot 206 that is empty and/or unused. In one example, because power supply slot 206 is empty and/or unused, network device 202 may be unable to receive and/or draw electrical power via power supply slot 206. However, an additional power supply (not necessarily illustrated in FIG. 2) may be installed and/or inserted into power supply slot 206. In the event of such an installation and/or insertion, power supply slot 206 may no longer be empty and/or unused. As a result, network device 202 may be able to receive and/or draw electrical power from that power supply installed and/or inserted into power supply slot 206.

Alternatively, an additional active power supply blank (not necessarily illustrated in FIG. 2) may be installed and/or inserted into power supply slot 206. In the event of such an installation and/or insertion, the additional active power supply blank may be able to receive and/or draw electrical power from the midplane circuit board of network device 202. Much like active power supply blank 102, this additional active power supply blank may use such electrical power to generate additional airflow that cools network device 202.

In a further example, a dummy power supply blank (not necessarily illustrated in FIG. 2) may be installed and/or inserted into power supply slot 206. In the event of such an installation and/or insertion, the dummy power supply blank may prevent air loss and/or the misdirection of airflow via power supply slot 206. Accordingly, this dummy power supply blank may cover the power supply slot but neither provide power to nor generate airflow for network device 202.

In some examples, active power supply blank 102 may be a Plug and Play (PnP) device capable of being installed without much, if any, device configuration and/or user intervention. In one example, active power supply blank 102 may replace a power supply in the corresponding power supply slot of network device 202. For example, a network administrator may remove a power supply from network device 202 and then installed active power supply blank 102 in its place. Accordingly, the power supply and active power supply blank 102 may be interchangeable with one another in this way.

In some examples, active power supply blank 102 may receive information from network device 202 and/or power supplies 204(1) and 204(2) via communication interface 108. In one example, communication interface 108 may communicatively couple, whether directly or indirectly, active power supply blank 102 to a midplane circuit board of network device 202. Additionally or alternatively, communication interface 108 may communicatively couple, whether directly or indirectly, active power supply blank 102 to power supplies 204(1) and 204(2).

In one example, the information received from the midplane circuit board and/or one or more of power supplies 204(1) and 204(2) may include and/or identify certain power-loading metrics for power supplies 204(1) and 204(2). Examples of such power-loading metrics include, without limitation, rotations per minute of one or more cooling fans installed with power supplies 204(1) and 204(2), ambient intake temperatures of the power supply slots in which power supplies 204(1) and 204(2) are installed, amounts of electrical power drawn by network device 202 from power supplies 204(1) and 204(2), combinations or variations of one or more of the same, and/or any other suitable power-loading metrics.

Continuing with this example, active power supply blank 102 may modify the airflow generated by cooling fan 106 based at least in part on the power-loading metrics for power supplies 204(1) and 204(2). For example, active power supply blank 102 may modify the rotational speed of cooling fan 106 to coincide with and/or match the rotational speed(s) of the cooling fans on power supplies 204(1) and 204(2). Additionally or alternatively, in the event that the ambient intake temperature measured by temperature sensor 110 is higher than the ambient intake temperatures measured at the slots where power supplies 204(1) and 204(2) are installed, active power supply blank 102 may increase the rotational speed of cooling fan 106 to cool the temperature at its slot and/or match the temperatures at the slots of power supplies 204(1) and 204(2).

Similarly, in the event that the ambient intake temperature measured by temperature sensor 110 is lower than the ambient intake temperatures measured at the slots where power supplies 204(1) and 204(2) are installed, active power supply blank 102 may decrease the rotational speed of cooling fan 106 to increase the temperature at its slot and/or match the temperature at the slots of power supplies 204(1) and 204(2). Accordingly, such modifications may represent a closed-loop and/or feedback feature that effectively enables active power supply blank 102 to generate airflow that is consistent with the airflow generated by fans on power supplies 204(1) and 204(2).

In some examples, active power supply blank 102 may modify the airflow generated by cooling fan 106 based at least in part on the amounts of electrical power drawn by network device 202 from one or more of power supplies 204(1) and 204(2). For example, in the event that network device 202 draws amounts of electrical power that are above a certain threshold from power supplies 204(1) and 204(2), active power supply blank 102 may increase the amount of airflow generated by cooling fan 106. However, in the event that network device 202 draws amounts of electrical power that are below a certain threshold from power supplies 204(1) and 204(2), active power supply blank 102 may decrease the amount of airflow generated by cooling fan 106.

In some examples, active power supply blank 102 may modify the airflow generated by cooling fan 106 based at least in part on audible noise levels of network device 202. For example, active power supply blank 102 may include an audio sensor and/or a microphone that measures the decibel level of audible noise generated by network device 202. Additionally or alternatively, network device 202 may include an audio sensor and/or a microphone that measures the decibel level of ambient audible noise. Moreover, one or more of power supplies 204(1) and 204(2) may include an audio sensor and/or a microphone that measures the decibel level of ambient audible noise.

In one example, in the event that the audible noise levels of network device 202 are below a certain threshold, active power supply blank 102 may increase the amount of airflow generated by cooling fan 106. However, in the event that the audible noise levels of network device 202 are above a certain threshold, active power supply blank 102 may decrease the amount of airflow generated by cooling fan 106.

In one example, active power supply blank 102 may detect a failure that prevents a cooling fan on power supply 204(1) or power supply 204(2) from operating and/or functioning properly. For example, active power supply blank 102 may receive a failure notification from the midplane circuit board, power supply 204(1), and/or power supply 204(2). The failure notification may indicate that the cooling fan on power supply 204(1) or power supply 204(2) has failed and/or is no longer functioning properly. In response to this failure, active power supply blank 102 may modify and/or increase the airflow generated by cooling fan 106 to compensate for the failed cooling fan on power supply 204(1) or power supply 204(2).

Figure 3:
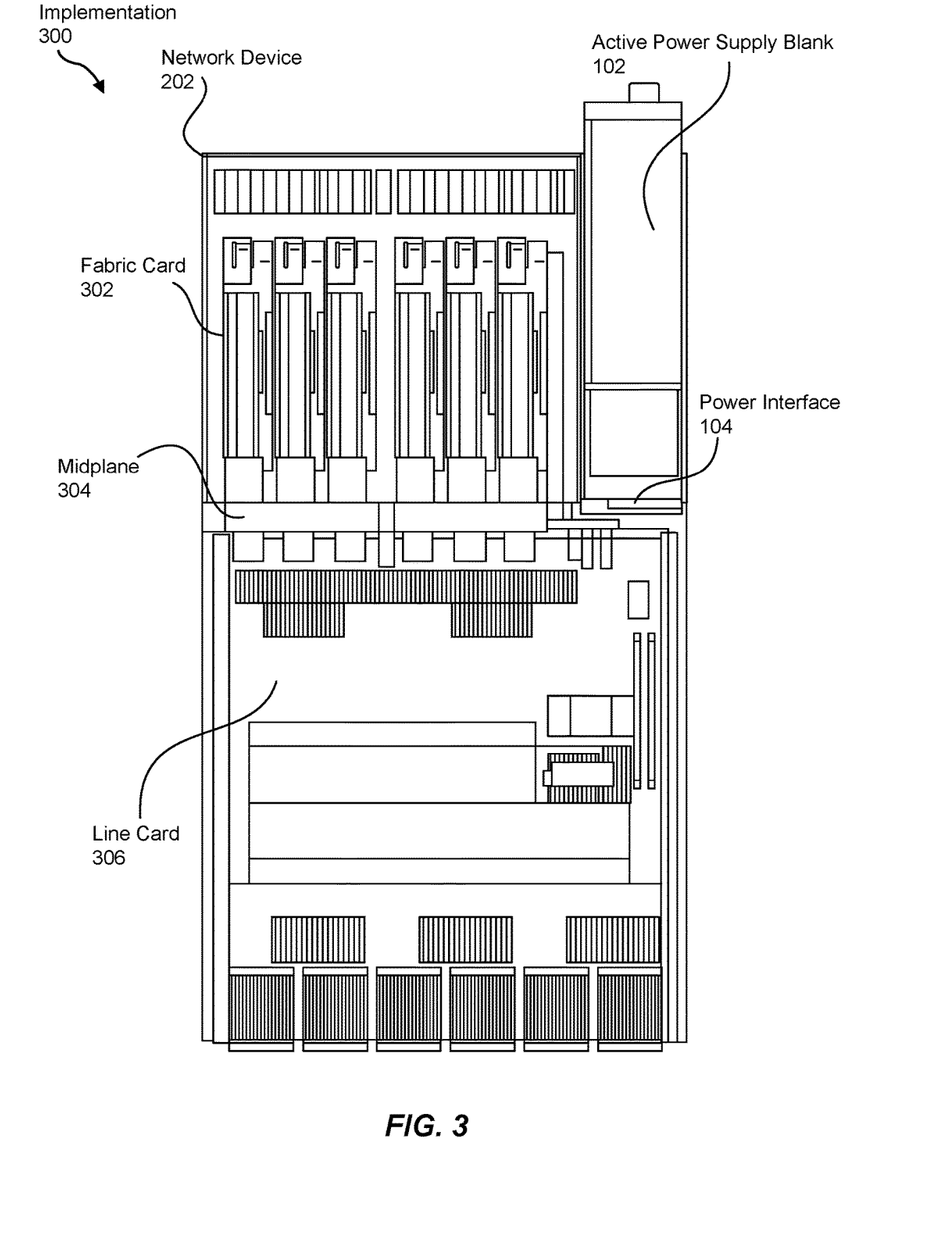
FIG. 3 is an illustration of an exemplary implementation of an apparatus for cooling network devices via unused power supply slots.

FIG. 3 illustrates an exemplary implementation 300 of apparatus 100 for cooling network devices via unused power supply slots. As illustrated in the top-down view of FIG. 3, exemplary implementation 300 may include, involve, and/or represent active power supply blank 102 installed in network device 202. In one example, network device 202 may include various other components and/or devices in addition to power supplies 204(1) and 204(2) and active power supply blank 102. For example, network device 202 may include a set of line cards that are stacked on top of one another. In this example, network device 202 may include a line card 306, which represents the top fabric card in the stack. As a result of the top-down view of FIG. 3, the other line cards in the stack may be covered by line card 306 and/or invisible in FIG. 3. This stacked set of line cards may be electrically and/or physically coupled to a midplane 304 within network device 202.

As illustrated in FIG. 3, network device 202 may include a set of fabric cards. In one example, the set of fabric cards may be vertically aligned and/or arranged side-by-side with one another within network device 202. In this example, the set of fabric cards may include fabric card 302. The set of fabric cards may be electrically and/or physically coupled to midplane 304 within network device 202. The set of fabric cards and the set of line cards may be oriented and/or positioned perpendicularly with respect to one another. In other words, the set of fabric cards and the set of line cards may extend across planes that are perpendicular with respect to one another.

Figure 4:
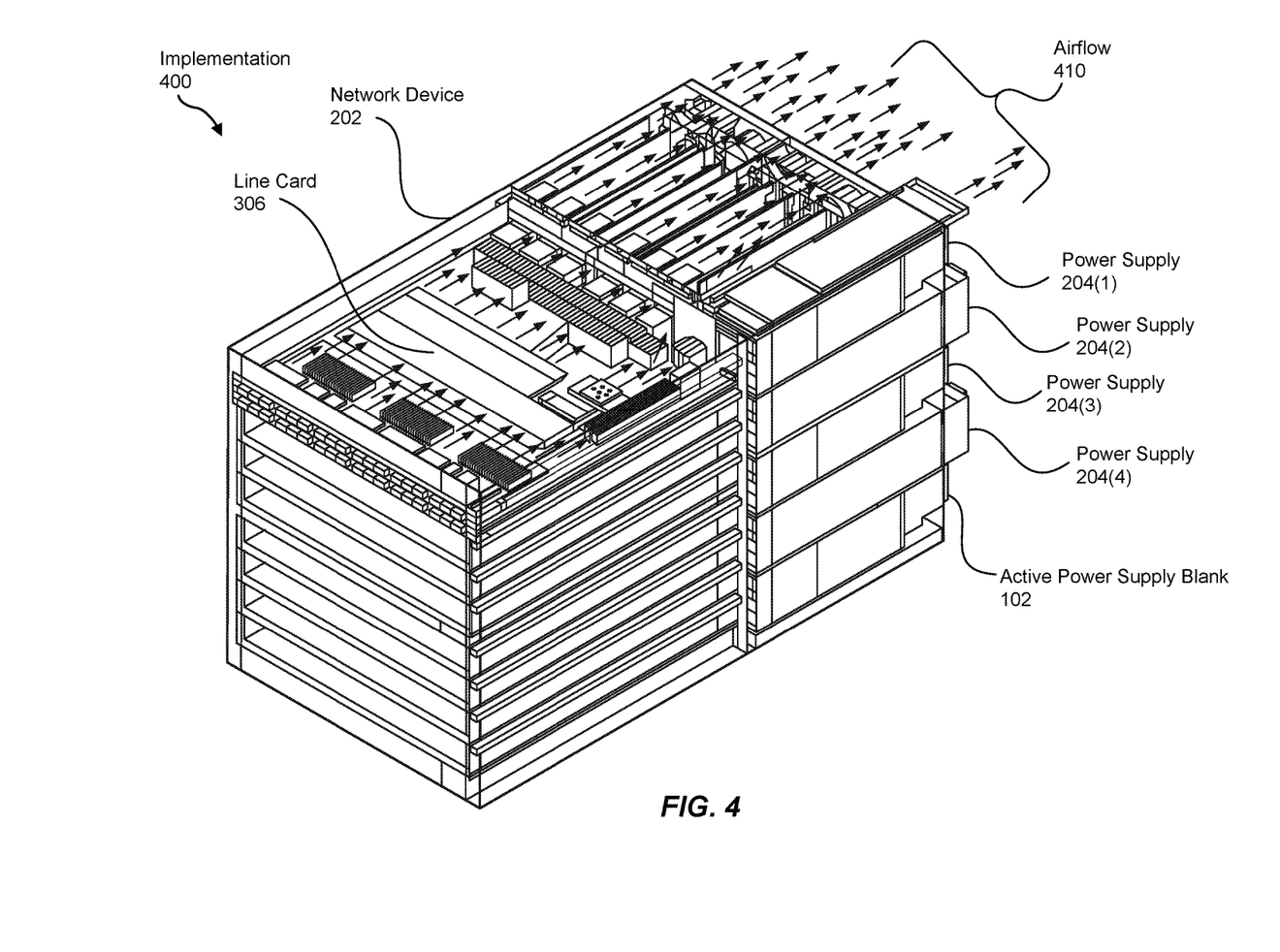
FIG. 4 is an illustration of an exemplary implementation of an apparatus for cooling network devices via unused power supply slots.

FIG. 4 illustrates an exemplary implementation 400 of apparatus 100 for cooling network devices via unused power supply slots. As illustrated in FIG. 4, exemplary implementation 400 may include, involve, and/or represent active power supply blank 102 installed in network device 202. In one example, implementation 400 may involve and/or generate airflow 410, which is represented by various arrows in FIG. 4.

In some examples, airflow 410 may be generated by a single component (such as active power supply blank 102) or a group of various components included in network device 202. For example, some of airflow 410 may represent a collection of air currents generated by cooling fans on power supplies 204(1), 204(2), 204(3), and/or 204(4) as well as cooling fan 106 on active power supply blank 102 in FIG. 4. In addition, some of airflow 410 may be generated by fans (not explicitly labeled in FIG. 4) on or near the set of line cards (including, e.g., line card 306). Moreover, some of airflow 410 may be generated by exhaust fans (not explicitly labeled in FIG. 4) on or near the set of fabric cards.

Figure 5:
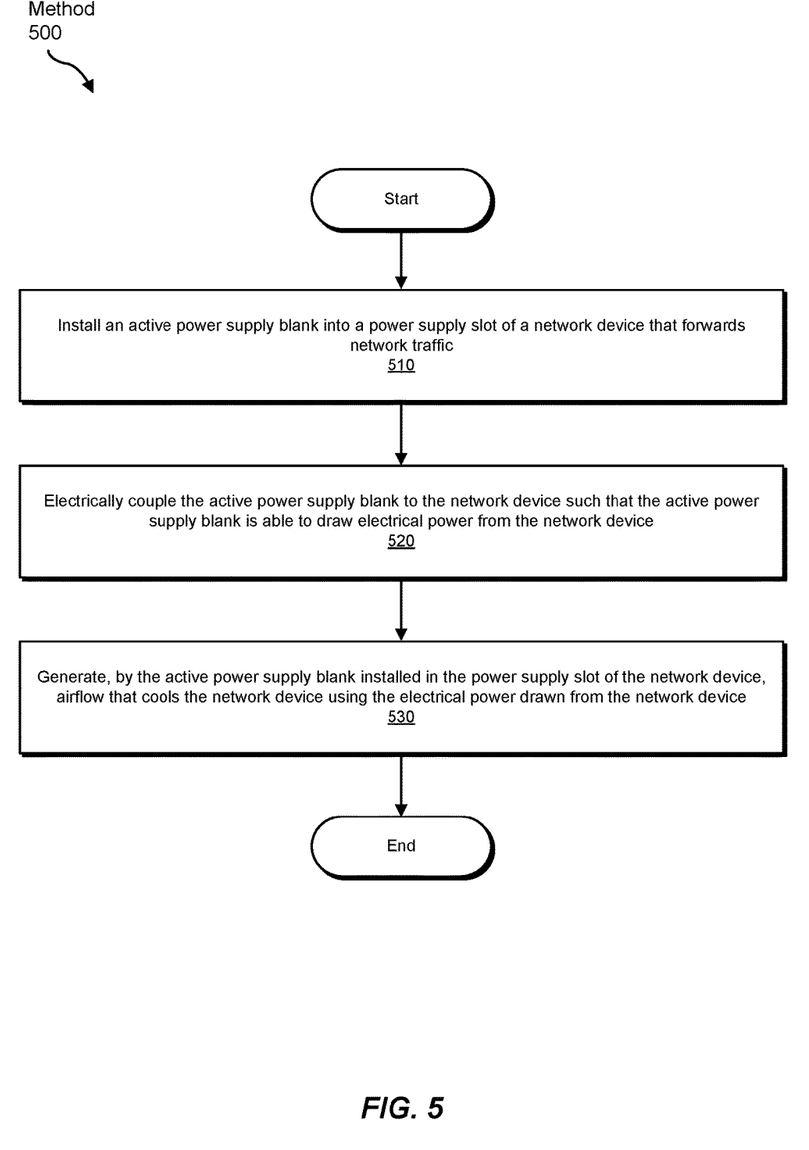
FIG. 5 is a flow diagram of an exemplary method for cooling network devices via unused power supply slots.

FIG. 5 is a flow diagram of an exemplary method 500 for cooling network devices via unused power supply slots. Method 500 may include the step of installing an active power supply blank into a power supply slot of a network device that forwards network traffic (510). Step 510 may be performed in a variety of ways, including any of those described above in connection with FIGS. 1-4. For example, a computing equipment manufacturer or subcontractor may install active power supply blank 102 into a power supply slot of network device 202. Alternatively, a network administrator may install active power supply blank 102 into a power supply slot of network device 202.

Method 500 may also include the step of electrically coupling the active power supply blank to the network device such that the active power supply blank is able to draw electrical power from the network device (520). Step 520 may be performed in a variety of ways, including any of those described above in connection with FIGS. 1-4. For example, the computing equipment manufacturer or subcontractor may plug power interface 104 of active power supply blank 102 into a power bus and/or midplane 304 of network device 202. Alternatively, a network administrator may plug power interface 104 of active power supply blank 102 into a power bus and/or midplane 304 of network device 202.

Method 500 may further include the step of generating airflow that cools the network device using the electrical power drawn from the network device (530). Step 530 may be performed in a variety of ways, including any of those described above in connection with FIGS. 1-4. For example, active power supply blank 102 may generate airflow that cools network device 202 using the electrical power drawn from the power bus and/or midplane 304 of network device 202.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered exemplary in nature since many other architectures can be implemented to achieve the same functionality.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. An apparatus comprising:
an active power supply blank that:
fits within a power supply slot of a network device that forwards network traffic; and
generates airflow that cools the network device; and
a power interface that electrically couples the active power supply blank to the network device, wherein the power interface enables the active power supply blank to:
draw electrical power from the network device; and
generate the airflow that cools the network device using the electrical power drawn from the network device;
a communication interface that communicatively couples the active power supply blank to the network device; and
wherein the active power supply blank:
receives, via the communication interface, information that identifies at least one power-loading metric for at least one power supply installed in at least one additional power supply slot of the network device, the power-loading metric comprising at least one of:
rotations per minute of at least one cooling fan installed with the power supply in the additional power supply slot; and
an amount of electrical power drawn by the network device from the power supply installed in the additional power supply slot; and
modifies, based at least in part on the power-loading metric identified in the information, the airflow to coincide with additional airflow generated by the power supply installed in the additional power supply slot.

2. The apparatus of claim 1, wherein the active power supply blank comprises a cooling fan that generates the airflow that cools the network device.

3. The apparatus of claim 1, wherein the active power supply blank replaces a power supply in the power supply slot of the network device.

4. The apparatus of claim 1, wherein the active power supply blank is interchangeable with a power supply designed for installation into the power supply slot of the network device.

5. The active power supply blank of claim 1, wherein the power-loading metric further comprises an ambient intake temperature of the additional power supply slot.

6. The apparatus of claim 1, further comprising a temperature sensor that measures ambient air temperature at the power supply slot; and
wherein the modification to the airflow is further based at least in part on the ambient air temperature measured by the temperature sensor at the power supply slot.

7. The apparatus of claim 1, wherein:
the communication interface is communicatively coupled to the power supply installed in the additional power supply slot; and
the communication interface receives the information that identifies the power-loading metric from the power supply installed in the additional power supply slot.

8. The apparatus of claim 1, wherein:
the communication interface is communicatively coupled to a midplane circuit board of the network device; and
the communication interface receives the information that identifies the power-loading metric from the midplane circuit board of the network device.

9. The apparatus of claim 1, the active power supply blank determines an audible noise level of the network device based at least in part on the power-loading metric identified in the information; and wherein the modification to the airflow is further based at least in part on the audible noise level of the network device determined by the active power supply blank.

10. The apparatus of claim 1, the active power supply blank detects a failure that prevents at least one cooling fan installed in the network device from operating; and wherein the modification to the airflow is further based at least in part on the failure that prevents the cooling fan installed in the network device from operating.

11. An active power supply blank comprising:

a cooling fan that:
fits within a power supply slot of a network device that forwards network traffic; and
generates airflow that cools the network device; and a power interface that electrically couples the cooling fan to the network device, wherein the power interface enables the cooling fan to:
draw electrical power from the network device; and
generate the airflow that cools the network device using the electrical power drawn from the network device;

a communication interface that communicatively couples the active power supply blank to the network device; and wherein the active power supply blank:
receives, via the communication interface, information that identifies at least one power-loading metric for at least one power supply installed in at least one additional power supply slot of the network device, the power-loading metric comprising at least one of:
rotations per minute of at least one cooling fan installed with the power supply in the additional power supply slot; and
an amount of electrical power drawn by the network device from the power supply installed in the additional power supply slot; and
modifies, based at least in part on the power-loading metric identified in the information, the airflow to coincide with additional airflow generated by the power supply installed in the additional power supply slot.

12. The active power supply blank of claim 11, wherein the power-loading metric further comprises an ambient intake temperature of the additional power supply slot.

13. The active power supply blank of claim 11, further comprising a temperature sensor that measures ambient air temperature at the power supply slot; and wherein the modification to the airflow is further based at least in part on the ambient air temperature measured by the temperature sensor at the power supply slot.

14. The active power supply blank of claim 11, wherein:
the communication interface is communicatively coupled to the power supply installed in the additional power supply slot; and
the communication interface receives the information that identifies the power-loading metric from the power supply installed in the additional power supply slot.

15. The active power supply blank of claim 11, wherein:
the communication interface is communicatively coupled to a midplane circuit board of the network device; and
the communication interface receives the information that identifies the power-loading metric from the midplane circuit board of the network device.

16. The active power supply blank of claim 11, the active power supply blank determines an audible noise level of the network device based at least in part on the power-loading metric identified in the information; and wherein the modification to the airflow is further based at least in part on the audible noise level of the network device determined by the active power supply blank.

17. The active power supply blank of claim 11, the active power supply blank detects a failure that prevents at least one cooling fan installed in the network device from operating; and wherein the modification to the airflow is further based at least in part on the failure that prevents the cooling fan installed in the network device from operating.

18. A method comprising:

installing an active power supply blank into a power supply slot of a network device that forwards network traffic;

electrically coupling the active power supply blank to the network device such that the active power supply blank is able to draw electrical power from the network device; and generating, by the active power supply blank installed in the power supply slot of the network device, airflow that cools the network device using the electrical power drawn from the network device;

receiving, via a communication interface that communicatively couples the active power supply blank to the network device, information that identifies at least one power-loading metric for at least one power supply installed in at least one additional power supply slot of the network device, the power-loading metric comprising at least one of:
rotations per minute of at least one cooling fan installed with the power supply in the additional power supply slot; and
an amount of electrical power drawn by the network device from the power supply installed in the additional power supply slot; and modifying, based at least in part on the power-loading metric identified in the information, the airflow to coincide with additional airflow generated by the power supply installed in the additional power supply slot.

* * * * *